(12) United States Patent
Shih

(10) Patent No.: US 8,537,546 B2
(45) Date of Patent: Sep. 17, 2013

(54) HOUSING WITH FOOT PADS AND COUPLERS

(75) Inventor: Cheng-Feng Shih, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 171 days.

(21) Appl. No.: 13/227,612

(22) Filed: Sep. 8, 2011

(65) Prior Publication Data

US 2013/0037546 A1 Feb. 14, 2013

(30) Foreign Application Priority Data

Aug. 9, 2011 (TW) .............................. 100214716 U

(51) Int. Cl.
*G06F 1/16* (2006.01)

(52) U.S. Cl.
USPC ................................... 361/679.59; 455/575.1

(58) Field of Classification Search
USPC ........ 248/188.8, 188.6, 188.9, 224.8, 222.12, 248/222.41, 317, 339, 341, 677, 166; 361/679.01, 679.02, 679.59, 807, 724, 767, 361/730; 455/575.1

See application file for complete search history.

(56) References Cited

U.S. PATENT DOCUMENTS

| | | | |
|---|---|---|---|
| 7,898,801 B2 * | 3/2011 | Wang et al. ............... | 361/679.59 |
| 8,139,357 B2 * | 3/2012 | Trang ........................ | 361/679.59 |
| 8,267,368 B2 * | 9/2012 | Torii et al. .................... | 248/677 |
| 2010/0002129 A1 * | 1/2010 | Zhou ............................. | 348/374 |
| 2012/0327628 A1 * | 12/2012 | Shih ............................. | 361/807 |

\* cited by examiner

*Primary Examiner* — Todd M. Epps
(74) *Attorney, Agent, or Firm* — Altis & Wispro Law Group, Inc.

(57) ABSTRACT

A housing includes a cover, a plurality of foot pads and a plurality of couplers. Each of the plurality of foot pads is fixed on a corresponding one of the couplers and each of the couplers is pivotable about the cover. The cover defines a plurality of first receiving portions and a plurality of second receiving portions for receiving the plurality of couplers and the plurality of foot pads. Each of the plurality of foot pads and each of the plurality of couplers rotates relative to the cover to selectively receive the foot pad and the coupler in the first receiving portion and in the second receiving portion, so as to suspend the housing from a wall and to place the housing on a supporting surface.

20 Claims, 5 Drawing Sheets

HOUSING WITH FOOT PADS AND COUPLERS

BACKGROUND

1. Technical Field

The present disclosure relates to a housing of an electronic device with a plurality of foot pads and a plurality of couplers.

2. Description of Related Art

Some items such as clocks, television sets, and digital photo frames may be configured for placement in many ways. Some items may be hung on a wall by use of a hook, supported on a surface, such as on a table or desk, or suspended from a ceiling. Often, items supported on a surface are provided with a number of foot pads to provide traction for the items. If the item is to be suspended from the ceiling, a number of couplers are provided on the housing for coupling with a hook on the ceiling. However, locations of the foot pads and locations of the couplers are generally different. Thus, the foot pads and couplers occupy too much space of the housing, and the foot pads and the couplers interact in assembly.

Therefore, it is desirable to provide a housing with foot pads and couplers, which can overcome or at least alleviate the above-mentioned problems.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
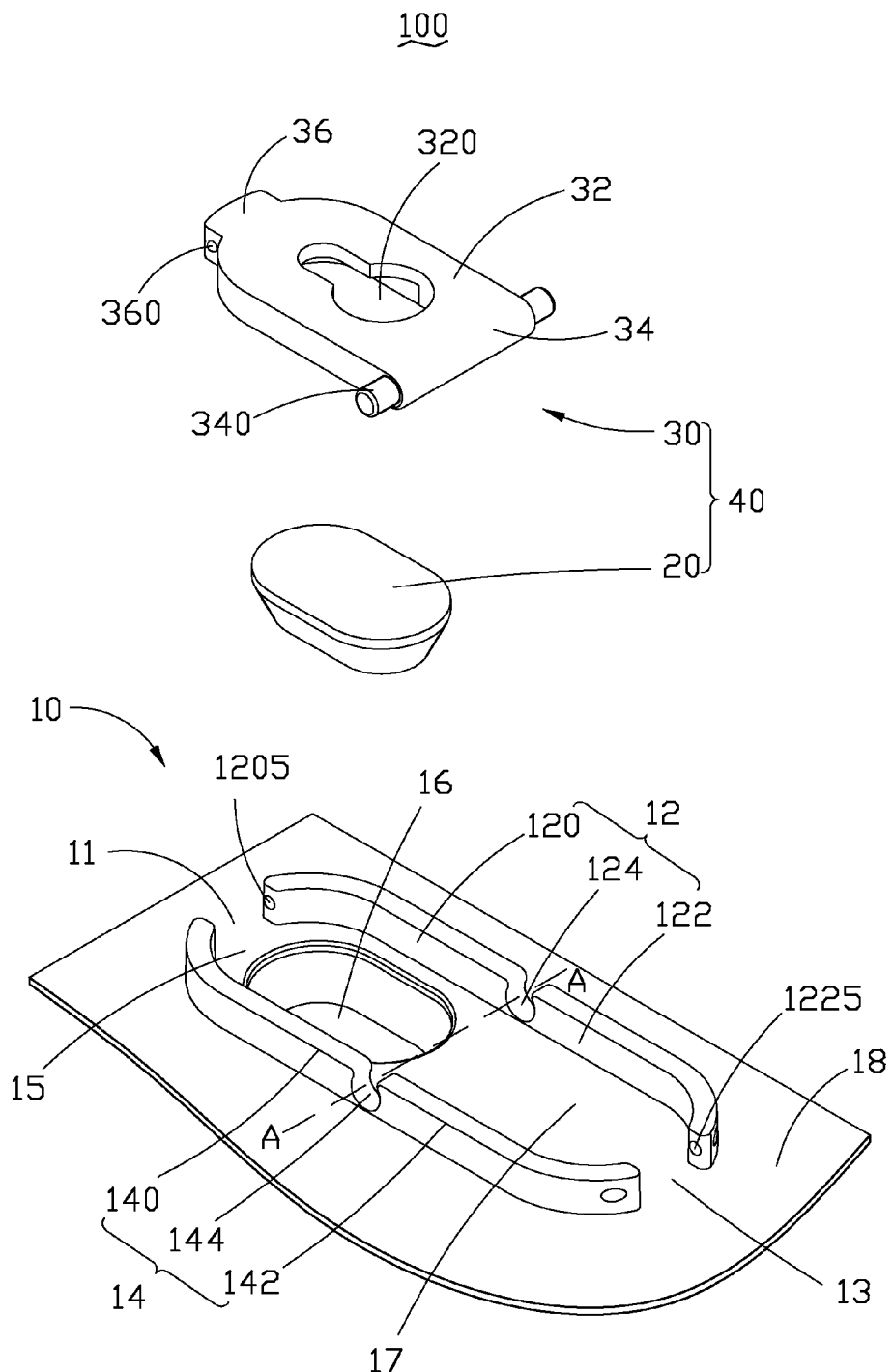
FIG. 1 is a disassembled perspective view of one exemplary embodiment of a housing in accordance with the present disclosure.
Figure 2:
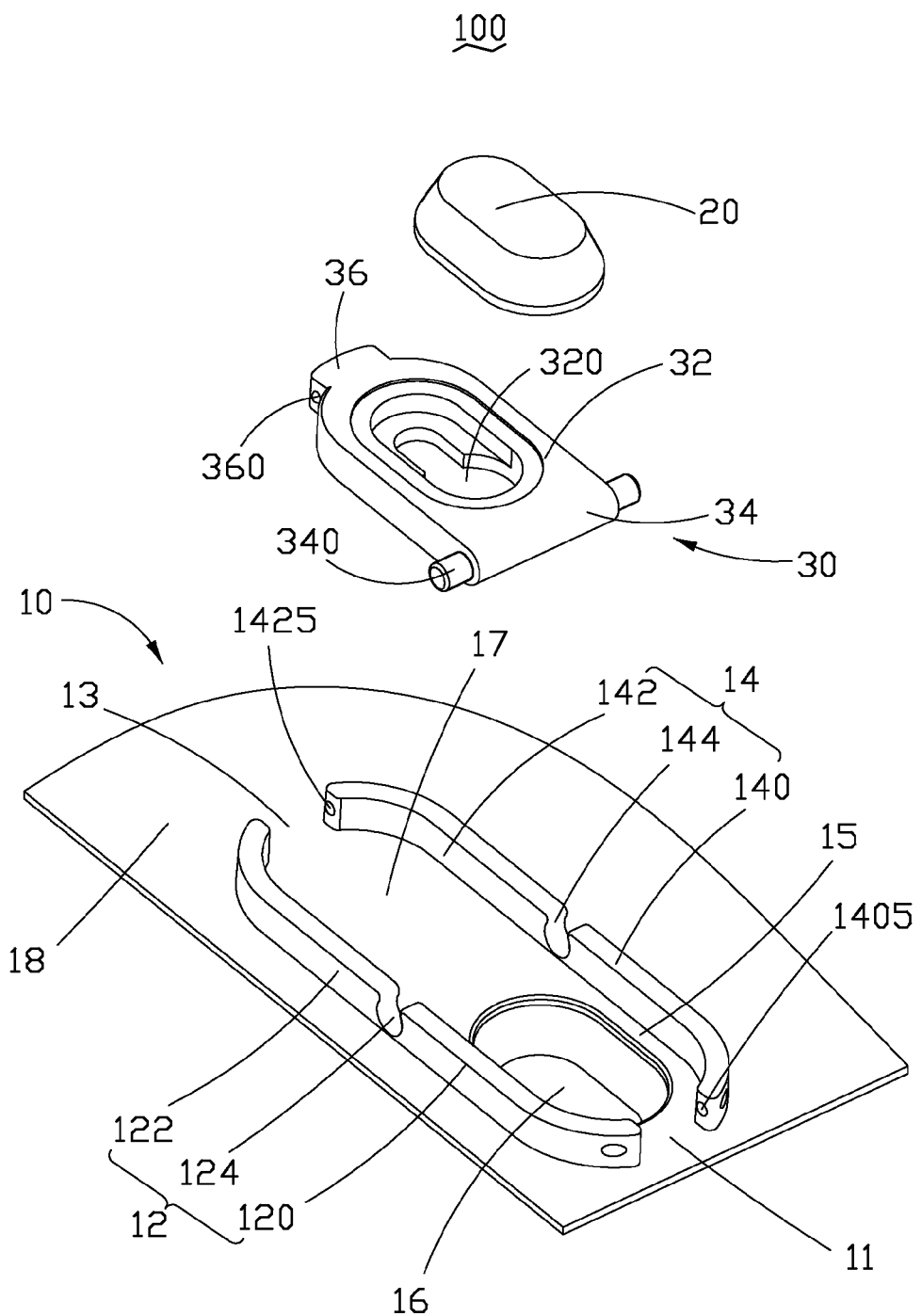
FIG. 2 is another disassembled perspective view of one exemplary embodiment of the housing of FIG. 1.

Referring to FIG. 1 and FIG. 2, a housing 100, according to an exemplary embodiment, comprises a cover 10 and a plurality of support assemblies 40 (only one shown). Each of the plurality of support assemblies 40 comprises a foot pad 20 and a coupler 30. The foot pad 20 is fixed on the corresponding coupler 30 and the coupler 30 is pivotable about the cover 10. In the illustrated embodiment, the housing 100 is a portion of an electronic device, such as a projector, a router, a switch or a telephone, for example, and houses electronic and mechanical parts of the electronic device. When the electronic device is to be used on a supporting surface, such as a desk, the item is oriented with cover 10 down to contact the support surface. When the electronic device is suspended from a ceiling or a wall, the item is oriented with the cover 10 up and engaged with a suspension means attached to the ceiling.

The cover 10 comprises a plurality of first baffling walls 12 (only one shown) and a plurality of second baffling walls 14 (only one shown), and defines a plurality of recessed grooves 16 (only one shown) configured between the corresponding first baffling walls 12 and the corresponding second baffling walls 14. Each of the plurality of first baffling walls 12 and each of the plurality of second baffling walls 14 protrude outwardly from an outer surface 18 of the cover 10, and each of the plurality of recessed grooves 16 recesses from the outer surface 18 to receive the corresponding foot pad 20. The first baffling wall 12 and the second baffling wall 14 are opposite to each other, and collectively form a first opening 11 and a second opening 13 opposite to the first opening 11. The first opening 11 and the second opening 13 are configured between the first baffling wall 12 and the second baffling wall 14 to space the first baffling wall 12 from the second baffling wall 14.

The first baffling wall 12 comprises a first segment 120 and a second segment 122, and defines a first latching groove 124 configured between the first segment 120 and the second segment 122. In the illustrated embodiment, the first segment 120 and the second segment 122 are symmetrically distributed according to the first latching groove 124. The second baffling wall 14 comprises a first segment 140 and a second segment 142, and defines a second latching groove 144 configured between the first segment 140 and the second segment 142. The first segment 140 is opposite to the first segment 120 of the first baffling wall 12 and collectively forms a first receiving portion 15 with first segment 120 of the first baffling wall 12. The first receiving portion 15 is used to receive the foot pad 20 and the coupler 30. The recessed groove 16 is configured between the first segment 120 of the first baffling wall 12 and the first segment 140 of the second baffling wall 14, and collectively forms a stepped receiving space with the first receiving portion 15. The second segment 142 of the second baffling wall 14 is opposite to the second segment 122 of the first baffling wall 112, and collectively forms a second receiving portion 17 with the second segment 122 of the first baffling wall 112 for receiving the coupler 30. In the illustrated embodiment, the first receiving portion 15 and the second receiving portion 17 communicate with each other and are symmetrical about a central line A-A of the first latching groove 124 and the second latching groove 144.

The first segment 120 of the first baffling wall 12 defines a first positioning hole 1205 on an end of the first segment 120 away from the first latching groove 124, and the first segment 140 of the second baffling wall 14 defines a first positioning hole 1405 on an end of the first segment 140 away from the second latching groove 144. The first positioning holes 1205 and 1405 are coupled in a pair to engage with the coupler 30 so as to fix the coupler 30 on the cover 10. Similarly, the second segment 122 of the first baffling wall 12 defines a second positioning hole 1225 on end of the second segment 122 away from the first latching groove 124, and the second segment 142 of the second baffling wall 14 defines a second positioning hole 1425 on end of the second segment 142 away from the second latching groove 144. The second positioning holes 1225 and 1425 are coupled in a pair to engage with the coupler 30 so as to fix the coupler 30 on the cover 10.

Figure 3:
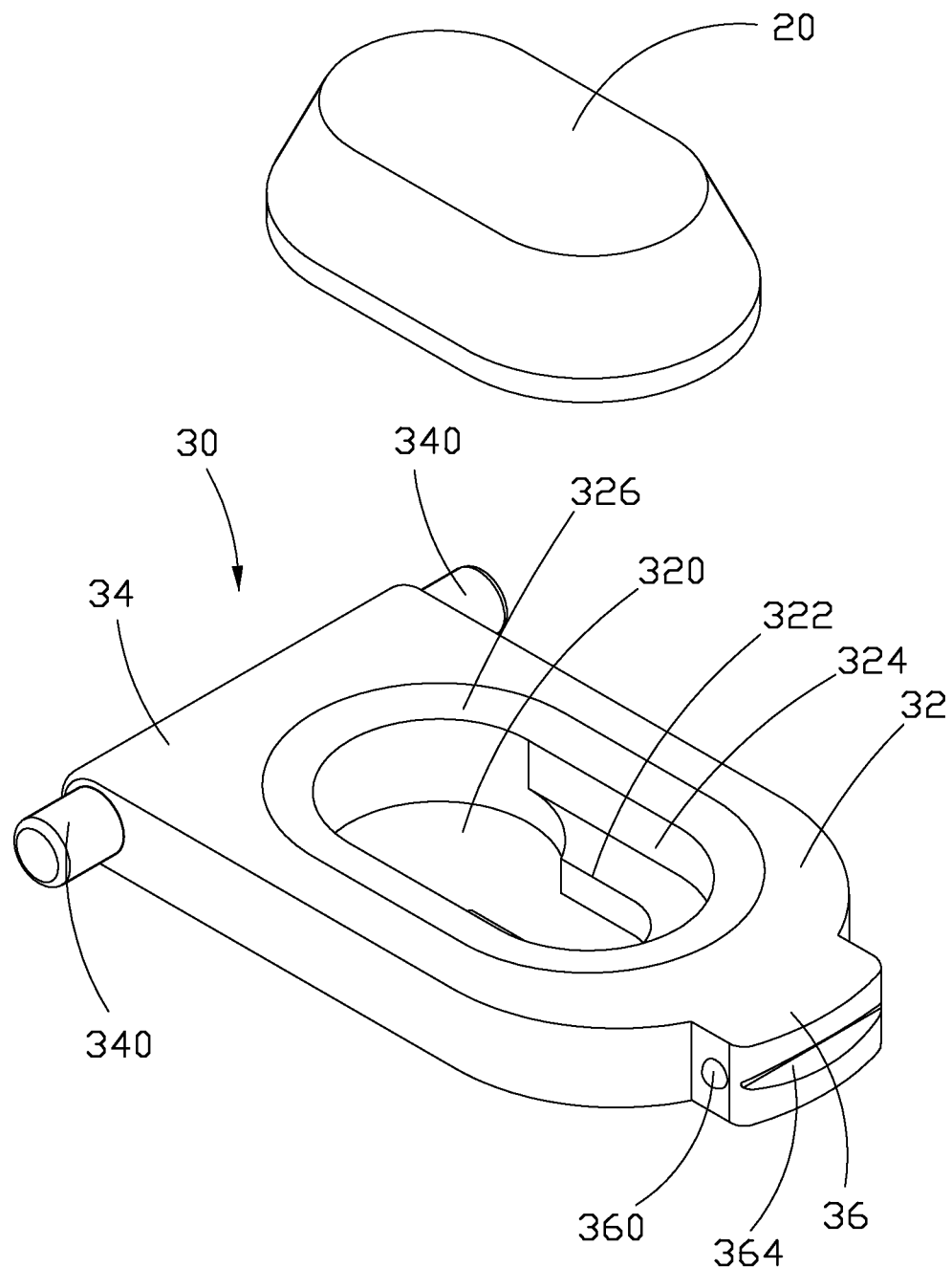
FIG. 3 is a disassembled perspective view of the exemplary embodiment of a foot pad and a coupler of FIG. 1.

Referring to FIG. 3, the coupler 30 comprises a main body 32, a rotating portion 34 and a fixing portion 36. The rotating portion 34 and the fixing portion 36 are configured on two ends of the main body 32 to engage with the cover 10, respectively. The main body 32 defines a gourd hole 320 and a receiving groove 324 communicating with the gourd hole 320, and comprises a resisting portion 322 protruding outwardly from inside wall of the receiving groove 324. When the housing 100 is suspended from the ceiling or the wall, a projection, such as a screw or a bolt, passes though the gourd hole 320 and is received in the receiving groove 324.

In the illustrated embodiment, the housing 100 is suspended from the ceiling or the wall via defining the gourd hole 320 on the coupler 30.

The foot pad 20 is securely fixed on the coupler 30. The main body 32 further comprises a fixing area 326 surrounding the receiving groove 324 and opposite to the gourd hole 320. The foot pad 20 can be securely pasted on the fixing area 326 by an adhesive to securely fasten the foot pad 20 on the coupler 30.

The rotating portion 34 comprises a pair of protruding shafts 340 protruding outwardly from two sides thereof. The pair of protruding shafts 340 engages with the first latching groove 124 and the second latching groove 144 to rotatably connect the coupler 30 with the cover 10.

The fixing portion 36 protrudes outwardly from the main body 32 away from the rotating portion 34 to be received in the first opening 11 or the second opening 13. The fixing portion 36 defines a pair of protrusions 360 protruding outwardly from two sides thereof. The pair of protrusions 360 is used to engage in the first positioning holes 1205 or the second positioning holes 1225. In detail, when the pair of protrusions 360 engages in the first positioning holes 1205 and 1405, the main body 32 is received in the first receiving portion 15 and the fixing portion 36 is received in the first opening 11 to securely mount the coupler 30 on the cover 10, and when the pair of protrusions 360 engages in the second positioning holes 1225 and 1425, the main body 32 is received in the second receiving portion 17 and the fixing portion 36 is received in the second opening 13 to securely mount the coupler 30 on the cover 10.

The fixing portion 36 further defines a slot 364. The slot 364 is configured on an end of the fixing portion 36 and away from the main body 32 for operation. An applied force to the slot 364 can be used to disengage the pair of protrusions 360 from the first positioning holes 1205 and 1405 or the second positioning holes 1225 and 1425, so as to disengage the fixing portion 36 from the cover 10.

In the illustrated embodiment, the fixing portion 36 is integrally formed with the main body 32 and the rotating portion 34.

In assembly, the foot pad 20 is securely glued on the fixing area 326 of the coupler 30. The pair of protruding shafts 340 engages in the first latching groove 124 and the second latching groove 144 to rotatably connect the coupler 30 and the foot pad 20 with the cover 10. The foot pad 20 is received in the recessed groove 16 and the main body 32 is received in the first receiving portion 15 by engaging the pair of protrusions 360 in the first positioning holes 1205 and 1405, so that the housing 100 is suspended from the ceiling or the wall by the couplers 30 engaging with the cover 10. The main body 32 is received in the second receiving portion 17 and the pair of protrusions 360 engages in the second positioning holes 1225 and 1425, so that the housing 100 is placed on the supporting surface by the foot pads 20. Therefore, the housing 100 can be changed between being suspended from the ceiling or the wall and being placed on the supporting surface.

Figure 4:
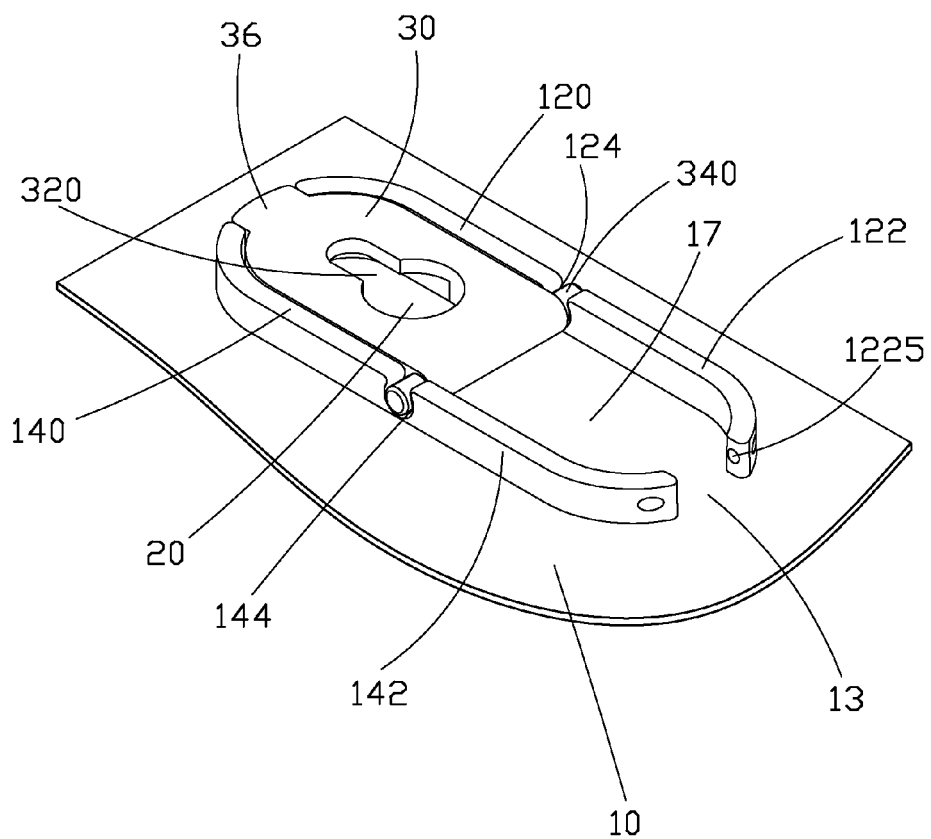
FIG. 4 is a perspective view of the exemplary embodiment of the housing in one using state in accordance with the present disclosure.

Referring to FIG. 4, the foot pad 20 is located between the coupler 30 and the cover 10. The foot pad 20 is received in the recessed groove 16 and the main body 32 is received in the first receiving portion 15, and the pair of protrusions 360 engages in the first positioning holes 1205 so that the fixing portion 36 is received in the first opening 11. At this time, the gourd hole 320 engagingly receives the projection on the ceiling or the wall to suspend the housing 100 from the ceiling or the wall.

Figure 5:
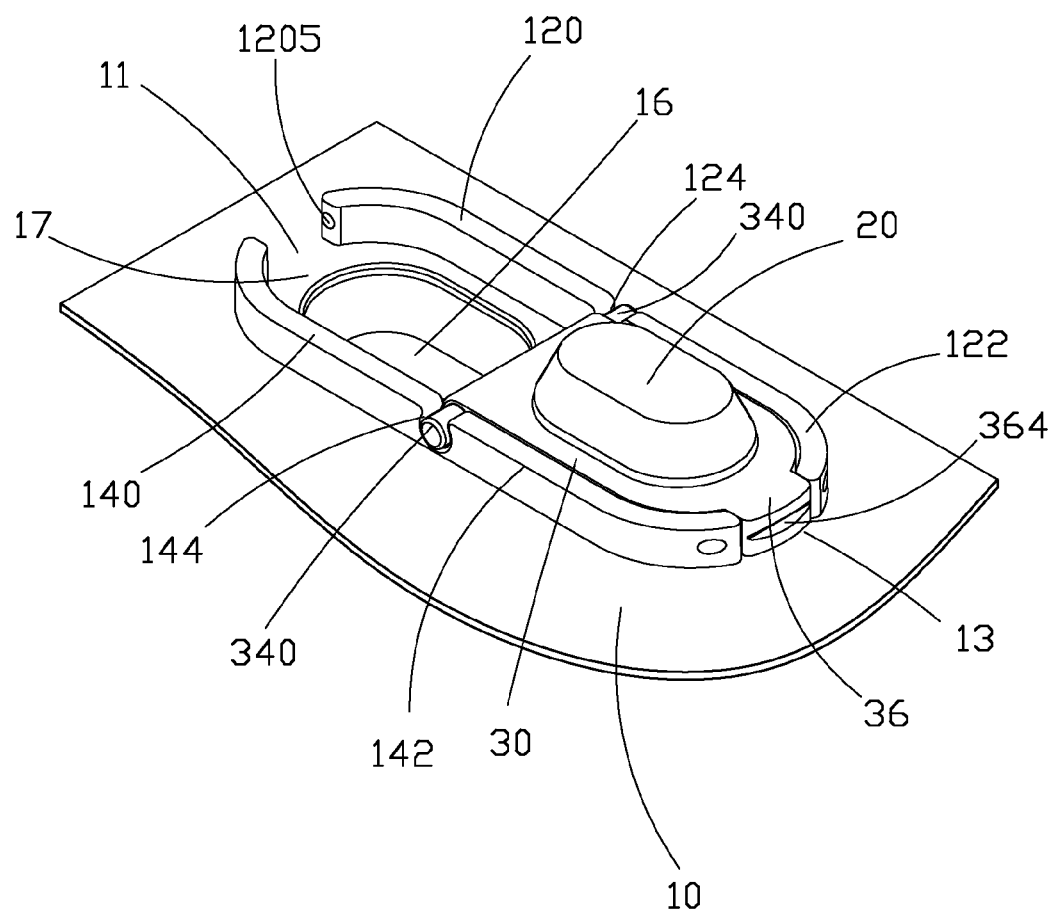
FIG. 5 is a perspective view of the exemplary embodiment of the housing in the other using state in accordance with the present disclosure.

Referring to FIG. 5, an applied force to the slot 364 can be used to disengage the pair of protrusions 360 from the first positioning holes 1205 to make the fixing portion 36 as a free end of the coupler 30. The coupler 30 rotates relative to the cover 10 to rotate the foot pad 20 away from the recessed groove 16, the main body 32 is gradually received in the second receiving portion 17, and the pair of protrusions 360 engages in the second positioning holes 1225 so that the fixing portion 36 is received in the second opening 13. Therefore, the foot pad 20 is exposed to the exterior to be placed on the supporting surface so as to support the housing 100; that is, the housing 100 is placed on the supporting surface.

The foot pad 20 is securely fixed on the coupler 30 and opposite to the gourd hole 320, the protruding shafts 340 engages with the first latching groove 124 and the second latching groove 144 to rotatably connect the coupler 30 with the cover 10. The foot pad 20 and the gourd hole 320 are switched by being rotated about the protruding shafts 340, so as to place the housing 100 on the supporting surface or to suspend the housing 100 from the ceiling or the wall.

Although the features and elements of the present disclosure are described as embodiments in particular combinations, each feature or element can be used alone or in other various combinations within the principles of the present disclosure to the full extent indicated by the broad general meaning of the terms in which the appended claims are expressed.

What is claimed is:

1. A housing, comprising a cover, a plurality of foot pads and a plurality of couplers, each of the plurality of foot pads fixed on a corresponding one of the couplers and each of the couplers being pivotable about the cover, the cover defining a plurality of first receiving portions and a plurality of second receiving portions for receiving the plurality of couplers and the plurality of foot pads, each of the plurality of foot pads and each of the plurality of couplers rotating relative to the cover to selectively receive the foot pad and the coupler in the first receiving portion and in the second receiving portion, so as to suspend the housing from a wall and to place the housing on a supporting surface.

2. The housing as claimed in claim 1, wherein the cover comprises a plurality of first baffling walls and a plurality of second baffling walls, each of the plurality of first baffling walls and each of the plurality of second baffling walls are opposite to each other, and collectively form the first receiving portion and the second receiving portion communicating with the first receiving portion.

3. The housing as claimed in claim 2, wherein the cover defines a plurality of recessed grooves, each of which is configured between the corresponding first baffling walls and the corresponding second baffling walls to receive the corresponding foot pad and communicates with the corresponding first receiving portion.

4. The housing as claimed in claim 2, wherein the cover defines a plurality of first latching grooves on the corresponding first baffling walls and a plurality of second latching grooves on the corresponding second baffling walls, each of the plurality of couplers comprises a pair of protruding shafts, and the pair of protruding shafts engages with the corresponding first latching groove and the corresponding second latching groove to rotatably connect the coupler with the cover.

5. The housing as claimed in claim 4, wherein each of the plurality of first baffling walls is symmetrical about the corresponding first latching groove and each of the plurality of second baffling walls is symmetrical about the corresponding second latching groove, and the first receiving portion and the second receiving portion are symmetrical about a central line of the first latching groove and the second latching groove.

6. The housing as claimed in claim 4, wherein the cover defines a plurality of first openings and a plurality of second openings configured between the corresponding first baffling walls and the corresponding second baffling walls and respectively located at two ends of the first baffling walls and the second baffling walls.

7. The housing as claimed in claim 6, wherein each of the plurality of first baffling walls and each of the plurality of second baffling walls collectively defines a pair of first positioning holes exposed to the first opening and a pair of second positioning holes exposed to the second opening, each of the plurality of couplers defines a pair of protrusions away from the pair of protruding shafts, the pair of protrusions engages in the pair of first positioning holes to position the coupler in the first receiving portion, and the pair of protrusions engages in the pair of second positioning holes to position the coupler in the second receiving portion.

8. The housing as claimed in claim 4, wherein each of the plurality of couplers comprises a main body, a rotating portion and a fixing portion configured on two ends of the main body, the pair of protruding shafts protrudes outwardly from the rotating portion, and the pair of protrusions protrudes outwardly from the fixing portion.

9. The housing as claimed in claim 8, wherein the main body defines a gourd hole and a receiving groove communicating with the gourd hole, and comprises a fixing area surrounding the receiving groove to be opposite to the gourd hole, and the foot pad is fixed on the fixing area to integrate the foot pad on the coupler.

10. The housing as claimed in claim 8, wherein the fixing portion protrudes outwardly from the main body away from the rotating portion.

11. The housing as claimed in claim 8, wherein each of the plurality of couplers defines a slot configured on an end of the fixing portion for disengaging the fixing portion from the cover.

12. A housing, comprising a cover and a plurality of support assemblies attached to the cover, each of the plurality of support assemblies comprising a coupler defining a gourd hole and a foot pad coupled to the coupler, the cover defining a plurality of receiving seats corresponding to the plurality of support assemblies, each of the receiving seats comprising a first receiving portion and a second receiving portion, the coupler being pivotably connected between the first receiving portion and the second receiving portion so that the foot pad and the coupler are selectively received in the first receiving portion and the second receiving portion by rotating the support assembly relative to the cover, and correspondingly the gourd hole and the foot pad are selectively workable.

13. The housing as claimed in claim 12, wherein the cover comprises a plurality of first baffling walls and a plurality of second baffling walls, each of the plurality of first baffling walls and each of the plurality of second baffling walls are opposite to each other, and collectively form the first receiving portion and the second receiving portion communicating with the first receiving portion.

14. The housing as claimed in claim 13, wherein the cover defines a plurality of recessed grooves, and each of the recessed grooves is configured between the corresponding first baffling walls and the corresponding second baffling walls to receive the corresponding foot pad and communicates with the corresponding first receiving portion.

15. The housing as claimed in claim 13, wherein the cover defines a plurality of first latching grooves on the corresponding first baffling walls and a plurality of second latching grooves on the corresponding second baffling walls, the coupler comprises a pair of protruding shafts, and the pair of protruding shafts engages with the corresponding first latching groove and the corresponding second latching groove to rotatably connect the coupler with the cover.

16. The housing as claimed in claim 15, wherein each of the plurality of first baffling walls is symmetrical about the corresponding first latching groove and each of the plurality of second baffling walls is symmetrical about the corresponding second latching groove, and the first receiving portion and the second receiving portion are symmetrical about a central line of the first latching groove and the second latching groove.

17. The housing as claimed in claim 15, wherein the cover defines a plurality of first openings and a plurality of second openings configured between the corresponding first baffling walls and the corresponding second baffling walls and respectively located at two ends of the first baffling walls and the second baffling walls.

18. The housing as claimed in claim 17, wherein each of the plurality of first baffling walls and each of the plurality of second baffling walls collectively defines a pair of first positioning holes exposed to the first opening and a pair of second positioning holes exposed to the second opening, each of the plurality of couplers defines a pair of protrusions away from the pair of protruding shafts, the pair of protrusions engages in the pair of first positioning holes to position the coupler in the first receiving portion, and the pair of protrusions engages in the pair of second positioning holes to position the coupler in the second receiving portion.

19. The housing as claimed in claim 15, wherein the coupler comprises a main body, and a rotating portion and a fixing portion configured on two ends of the main body, the pair of protruding shafts protrudes outwardly from the rotating portion, and the pair of protrusions protrudes outwardly from the fixing portion.

20. The housing as claimed in claim 19, wherein the gourd hole is defined in the main body the main body defines a receiving groove communicating with the gourd hole, the main body comprises a fixing area surrounding the receiving groove to be opposite to the gourd hole, and the foot pad is fixed on the fixing area to integrate the foot pad on the coupler.

\* \* \* \* \*